(12) United States Patent
Vella et al.

(10) Patent No.: US 11,096,288 B2
(45) Date of Patent: Aug. 17, 2021

(54) FLEXIBLE CONDUCTIVE PRINTED CIRCUITS WITH PRINTED OVERCOATS

(71) Applicant: Xerox Corporation, Norwalk, CT (US)

(72) Inventors: Sarah J. Vella, Milton (CA); Yujie Zhu, Mississauga (CA); Chad S. Smithson, Guelph (CA)

(73) Assignee: Xerox Corporation, Norwalk, CT (US)

( * ) Notice: Subject to any disclaimer, the term of this patent is extended or adjusted under 35 U.S.C. 154(b) by 0 days.

(21) Appl. No.: 16/722,983

(22) Filed: Dec. 20, 2019

(65) Prior Publication Data

US 2021/0195759 A1    Jun. 24, 2021

(51) Int. Cl.
*H05K 3/28*     (2006.01)
*H05K 1/03*     (2006.01)
*B41M 5/00*     (2006.01)

(52) U.S. Cl.
CPC .......... *H05K 3/285* (2013.01); *H05K 1/0393* (2013.01); *B41M 5/0047* (2013.01); *H05K 2203/013* (2013.01); *H05K 2203/0746* (2013.01); *H05K 2203/0759* (2013.01)

(58) Field of Classification Search
CPC .......... H05K 1/0393; H05K 2203/013; H05K 1/0298; H05K 3/46; H05K 3/125; H05K 3/4655; H05K 1/00; H05K 2203/0759; B05D 2503/00; C09D 175/00; C09D 175/04

USPC .......................................... 427/8; 428/355 R
See application file for complete search history.

(56) References Cited

U.S. PATENT DOCUMENTS

| | | | |
|---|---|---|---|
| 5,652,286 A * | 7/1997 | Deng | C09D 11/36 523/160 |
| 2005/0147737 A1* | 7/2005 | Shinkai | H05K 3/4679 427/58 |
| 2006/0019077 A1* | 1/2006 | Hopper | C09D 11/30 428/209 |
| 2008/0190482 A1* | 8/2008 | De Jonge | H01L 31/022466 136/252 |
| 2014/0035995 A1* | 2/2014 | Chou | B41J 2/01 347/20 |
| 2016/0088741 A1* | 3/2016 | Van Den Bersselaar | H05K 3/38 174/251 |
| 2019/0117124 A1* | 4/2019 | Hsu | A61B 5/6807 |
| 2020/0010677 A1* | 1/2020 | Lee | C08J 7/0427 |

* cited by examiner

*Primary Examiner* — Tabassom Tadayyon Eslami

(57) ABSTRACT

A method for producing flexible conductive printed circuit with a printed overcoat is disclosed. For example, the method includes forming conductive printed circuit lines on a flexible substrate, detecting locations on the flexible substrate where the conductive printed circuit lines are formed, and printing an overcoat over the conductive printed circuit lines at the locations that are detected on the flexible substrate, wherein the overcoat comprises a mixture of thermoplastic polyurethane (TPU) and a solvent having a viscosity of 1 centipoise to 2,000 centipoise to allow the mixture to be printed.

11 Claims, 4 Drawing Sheets

FLEXIBLE CONDUCTIVE PRINTED CIRCUITS WITH PRINTED OVERCOATS

The present disclosure relates generally to printed circuits and, more particularly, to flexible conductive printed circuits with printed overcoats and methods for producing the same.

BACKGROUND

Printed electronics is an emerging industry that aims to print low cost electronic components to add function to otherwise inanimate objects. For example, printed electronics can be used to add functionality to clothing, sporting equipment, storage containers, and the like.

Unlike conventional electronics, printed electronics are not restricted to rigid substrates. Digitally printable conductive inks that are currently available are generally not flexible, often suffer from low scratch resistance, and can have poor adhesion to substrates. Due to these factors, the application of these digitally printable conductive inks has been limited in a number of areas that use highly robust circuitry.

For instance, conductive circuits for smart packaging must survive long-distance shipping and rough handling. Although a great effort has been made to develop flexible conductive inks, there are few digitally printable products showing up in the market. The few that do exist do not have the high conductivity required for many of these emerging applications.

SUMMARY

According to aspects illustrated herein, there are provided a method, non-transitory computer readable medium, and an apparatus for producing flexible conductive printed circuits with a printed overcoat. One disclosed feature of the embodiments is a method that forms conductive printed circuit lines on a flexible substrate, detects locations on the flexible substrate where the conductive printed circuit lines are formed, and prints an overcoat over the conductive printed circuit lines at the locations that are detected on the flexible substrate, wherein the overcoat comprises a mixture of thermoplastic polyurethane (TPU) and a solvent having a viscosity of 1 centipoise to 2,000 centipoise to allow the mixture to be printed.

Another disclosed feature of the embodiments is a non-transitory computer-readable medium having stored thereon a plurality of instructions, the plurality of instructions including instructions which, when executed by a processor, cause the processor to perform an operation to form conductive printed circuit lines on a flexible substrate, detect locations on the flexible substrate where the conductive printed circuit lines are formed, and print an overcoat over the conductive printed circuit lines at the locations that are detected on the flexible substrate, wherein the overcoat comprises a mixture of thermoplastic polyurethane (TPU) and a solvent having a viscosity of 1 centipoise to 2,000 centipoise to allow the mixture to be printed.

Another disclosed feature of the embodiments is an apparatus comprising a processor and a computer readable medium storing a plurality of instructions which, when executed by the processor, cause the processor to perform an operation that forms conductive printed circuit lines on a flexible substrate, detects locations on the flexible substrate where the conductive printed circuit lines are formed, and prints an overcoat over the conductive printed circuit lines at the locations that are detected on the flexible substrate, wherein the overcoat comprises a mixture of thermoplastic polyurethane (TPU) and a solvent having a viscosity of 1 centipoise to 2,000 centipoise to allow the mixture to be printed.

BRIEF DESCRIPTION OF THE DRAWINGS

The teaching of the present disclosure can be readily understood by considering the following detailed description in conjunction with the accompanying drawings, in which.

To facilitate understanding, identical reference numerals have been used, where possible, to designate identical elements that are common to the figures.

DETAILED DESCRIPTION

The present disclosure is related to a flexible conductive printed circuit with a printed overcoat and a method for making the same. As discussed above, printed electronics is an emerging industry that aims to print low cost electronic components. However, the currently available digitally printable conductive inks suffer drawbacks, such as not being flexible, having low scratch resistance, and poor adhesion.

The present disclosure provides a solution to the issues associated with digitally printable conductive inks. The present disclosure provides a flexible conductive printed circuit that is protected with a printable overcoat. The overcoat can be precisely printed over the printed circuits, rather than being applied via a blanket coating, draw down coating, or spray coating. Other methods such as blanket coating, draw down coating, and spray coating can waste material and be imprecise, causing the material to perhaps react negatively with other components on the flexible substrate.

In one embodiment, the overcoat of the present disclosure may be a printable flexible overcoat layer on top of the delicate conductive traces of the printed electronics. Besides flexibility and digital printability, the printable flexible overcoat ink of the present disclosure provides compatibility and strong adhesion to the conductive traces of the printed electronics. The printable flexible overcoat ink composition also provides strong scratch resistance.

Figure 1:
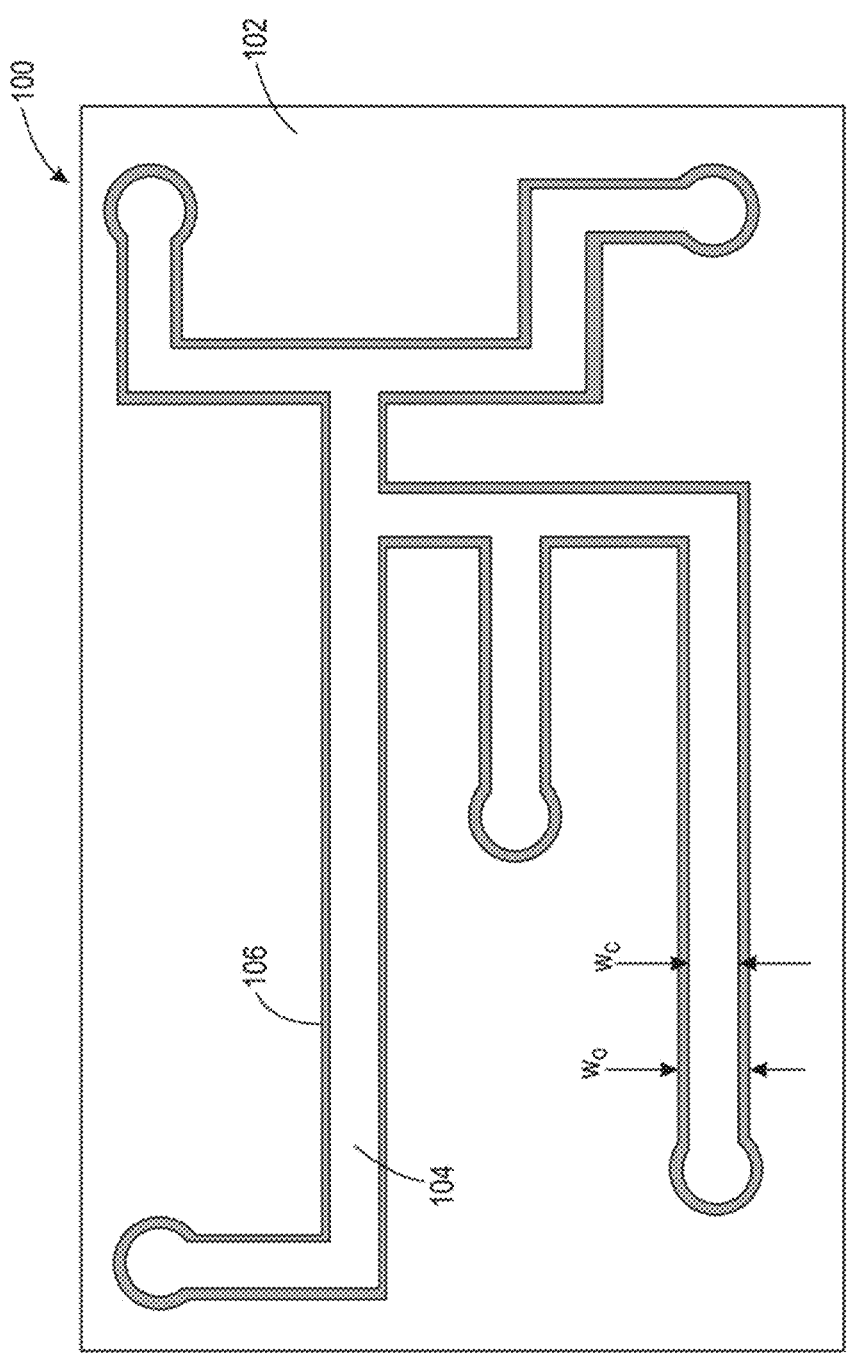
FIG. 1 illustrates an example of a flexible conductive printed circuits with printed overcoats of the present disclosure.

FIG. 1 illustrates an example of a flexible conductive printed circuit 100 of the present disclosure. In one example, the flexible conductive printed circuit 100 may include a substrate 102. In one embodiment, the substrate 102 may be flexible. The substrate 102 may comprise carton board, glass, polyethylene terephthalate (PET), polycarbonate (PC), polyethylene naphthalate (PEN), polystyrene (PS), polyethylene (PE), polymethylmethacrylate, poly(vinyl chloride), cellulose, and the like.

In one embodiment, the flexible conductive printed circuit 100 may include printed circuit lines 104. The printed circuit lines 104 may be etched or printed into the substrate 102 and filled with a conductive material. The conductive material may be any type of conductive material such as silver, gold, copper, and the like.

In one embodiment, the conductive printed circuit 100 may include an overcoat 106. The overcoat 106 may be digitally printed over the printed circuit lines 104. For example, the overcoat 106 may be applied via a printer (e.g., an inkjet printer or an aerosol jet printer) precisely over the printed circuit lines 104. Said another way, the overcoat 106 may be digitally printed on portions of the substrate 102 that include the printed circuit lines 104. The overcoat 106 may be printed at a width ($W_o$) that is approximately equal to, or slightly larger than, a width ($W_e$) of the printed circuit lines 104.

As noted above, the overcoat 106 may be formulated to allow the overcoat 106 to be digitally printed. Unlike other methods that blanket coat, spray coat, or draw down coat a material over the entire substrate, the overcoat 106 can be digitally printed on desired locations with precision. For example, the overcoat 106 may be printed to widths as small as several hundred microns.

It should be noted that the flexible conductive printed circuit 100 has been simplified for ease of explanation and may include other features or devices that are not shown. The flexible conductive printed circuit 100 may be electrically coupled to other devices, power sources, controllers, and the like as part of an electronic device. For example, the flexible conductive printed circuit 100 may be applied to clothing, packaging, and the like.

Figure 2:
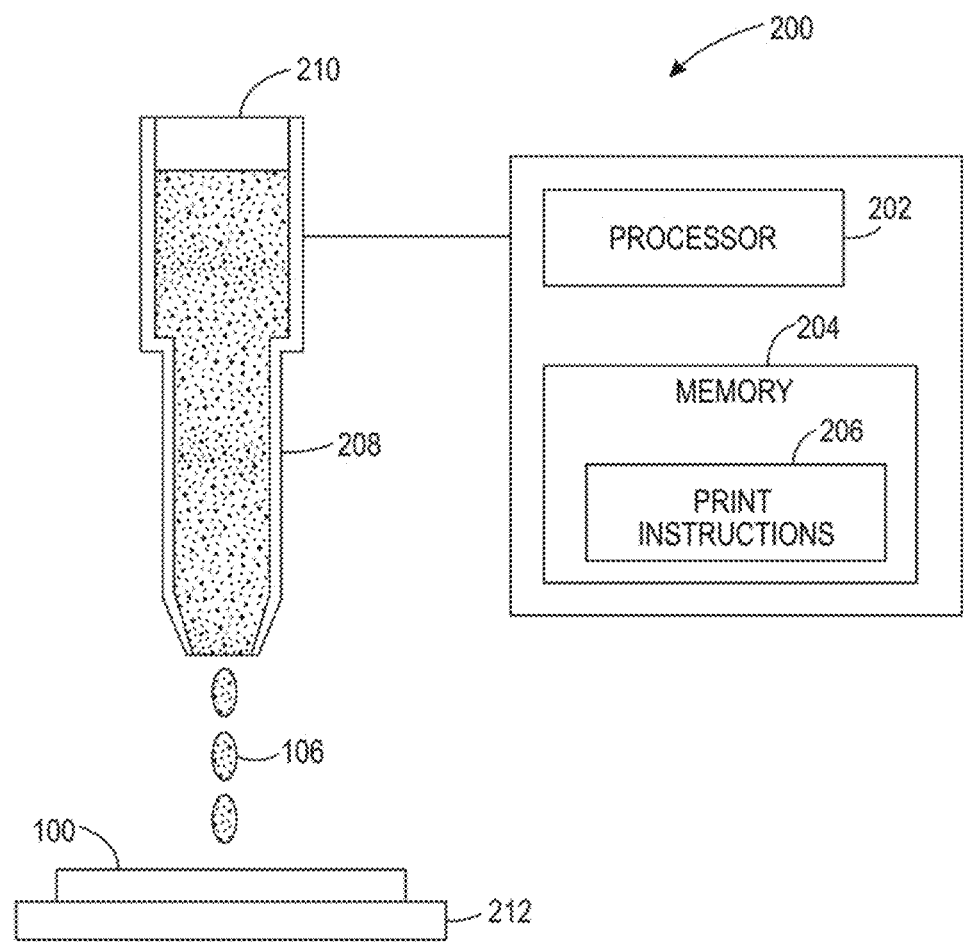
FIG. 2 illustrates an example system to produce the flexible conductive printed circuits with printed overcoats of the present disclosure.

FIG. 2 illustrates an example system 200 to produce the flexible conductive printed circuit 100. In one embodiment, the system 200 may be an apparatus such as an inkjet printer or an aerosol jet printer that is under the control of a controller or processor.

In one embodiment, the system 200 may include a processor 202 and a memory 204. The processor 202 may execute instructions stored in the memory 204. The memory 204 may be any type of non-transitory computer readable memory, such as a hard disk drive, a solid state drive, read only memory, random access memory, and the like.

In one embodiment, the memory 204 may include print instructions 206. The print instructions 206 may include stored locations of the printed circuit lines 104 on the substrate 102. For example, as the printed circuit lines 104 are printed, the locations may be stored in the memory 204 and provided as part of the print instructions 206. In another embodiment, after the printed circuit lines 104 are formed in the substrate 102, the substrate 102 may be scanned to detect and determine the locations of the printed circuit lines 104. The locations of the printed circuit lines 104 may be stored as part of the print instructions 206 in the memory 204.

In one embodiment, the system 200 may also include a printhead 208 that includes a reservoir 210. The reservoir 210 may store the overcoat 106. In one embodiment, the printhead 208 may be movable along a two-dimensional coordinate system over the flexible conductive printed circuit 100. In one embodiment, the printhead 208 may be fixed and the flexible conductive printed circuit 100 may be positioned on a platform 212 that can be moved below the printhead 208 along a two-dimensional coordinate system.

In one embodiment, the processor 202 may control the printhead 208 to dispense the overcoat 106 in accordance with the print instructions 206. The processor 202 may control to printhead 208 to print the overcoat 106 over the printed circuit lines 104.

In one embodiment, the overcoat may be a printable overcoat ink having a composition that includes a mixture of a thermoplastic polyurethane (TPU) and a solvent. The mixture of the TPU and the solvent may be an emulsion that is mixed to have a viscosity that allows the printable overcoat ink composition to be digitally printed via an inkjet printhead or an aerosol jet printhead. In one embodiment, the viscosity may be between approximately 1 centipoise to 2,000 centipoise.

TPU may be a type of polyurethane plastic that has properties of elasticity, transparency, and resistance to abrasion or scratches. The TPU may be an elastomer that consists of linear segmented block copolymers composed of hard and soft segments. The TPU in its raw form cannot be digitally printed. However, the embodiments of the present disclosure formulate the TPU with a solvent to a desired viscosity to allow the TPU to be digitally printed (e.g., over conductive traces on a printed circuit board).

In one embodiment, the mixture may be formed with TPU that has an average diameter of approximately 1 nanometer (nm) to 1,000 nm. In one embodiment, the TPU may have an average diameter of approximately 5 nm to 500 nm. In one embodiment, the TPU may have an average diameter of approximately 10 nm to 200 nm.

In one embodiment, the TPU may be purchased as a latex dispersion. In other words, the TPU dispersion may include a stable dispersion of the TPU particles in water. Notably, the TPU is not dissolved in the water, but remains in a solid form evenly dispersed in the solution (e.g., a colloidal dispersion). The TPU latex dispersion may be purchased from a variety of vendors such as Alberdingk Boley Inc., Covestro, and the like under the tradenames of Alberdingk U 410, Alberdingk U 615, Alberdingk U 2101, Bayhydrol U2757, Bayhydrol U2559, Bayhydrol 2606, and the like.

In one embodiment, the solvent may be a high boiling point solvent. The high boiling point of the solvent may allow the mixture of the TPU and solvent to remain stable when stored in a cartridge for printing at room temperature. In other words, the high boiling point solvent may enable stable printing of the ink in both inkjet printing and aerosol jet printing, and ensure that the mixture does not dry out or evaporate inside of a reservoir (e.g., the printhead). The solvents may be selected from groups of solvents that are compatible with the TPU dispersion (e.g., the solvent does not disrupt the TPU dispersion). Examples of the solvents that can be used may include water, ethylene glycol, diethylene glycol, sulfolane, propylene glycol methyl ether acetate, propylene glycol monomethyl ether acetate, di(propylene glycol) methyl ether acetate, (propylene glycol) methyl ether, di(propylene glycol) methyl ether, methyl isobutyl ketone, diisobutyl ketone, butyl acetate, methoxypropylacetate, or propoxylated neopentylglycoldiacrylate, or any combination thereof.

In one embodiment, the amount of TPU in a dispersion form and solvent in the mixture may have a ratio of approximately 1:1 to 1:20 of TPU to solvent for inkjet printers and approximately 10:1 to 1:20 for aerosol jet printers.

In one embodiment, the amount of TPU to solvent may range from approximately 1:4 to 2:1. In one embodiment, the amount solid TPU to solvent may have a ratio of approximately 1:8 for inkjet printers and approximately 1:4 for aerosol jet printers. Thus, the ratios may vary based on whether the TPU in a dispersion form is measured or the solid TPU is measured. In one embodiment, the total solid content of the TPU in the mixture may be approximately 1 percent to 60 percent. In one embodiment, the solid content may be approximately 10-25 percent. In one embodiment, the solid content may be approximately 5-15 percent.

In one embodiment, the printable flexible overcoat ink composition may be formulated for an inkjet printhead. For example, the printable flexible overcoat ink composition may be formulated with a ratio of 1:2 (e.g., of weight) of solid TPU to solvent. The printable flexible overcoat ink composition may have a total solid TPU content of approximately 13 percent by weight. The mixture may be mixed to have a viscosity of approximately 1-40 centipoise.

The printable flexible overcoat ink composition may be formulated such that the composition can be digitally printed without clogging printheads and/or quickly evaporating out of the printhead reservoir. The composition may also remain flexible after printing and curing to protect conductive traces that are protected by the printable flexible overcoat ink composition.

Inkjet Printer Example

In one embodiment, a mixture of 1.0 grams of Alberdingk U615 and 2.0 grams of ethylene glycol was loaded into a glass vial. The mixture was vortexed to mix the Alberdingk U615 and the ethylene glycol well. The mixture was allowed to settle for approximately 30 minutes. The mixture had a viscosity of approximately 5-14 centipoise. The mixture was produced to have a total solid TPU content of approximately 13 percent.

In a second embodiment, a mixture of 1.0 grams of Alberdingk U615 and 1.0 grams of ethylene glycol was loaded into a glass vial. The mixture was vortexed to mix the Alberdingk U615 and the ethylene glycol well. The mixture was allowed to settle for approximately 30 minutes. The mixture was produced to have a total solid TPU content of approximately 20 percent.

In the third embodiment, a mixture of 1.0 grams of Alberdingk U2101 and 2.0 grams of ethylene glycol was loaded into a glass vial. The mixture was vortexed to mix the Alberdingk U2101 and the ethylene glycol well. The mixture was allowed to settle for approximately 30 minutes. The mixture was produced to have a total solid TPU content of approximately 13 percent.

A Dimatix 2300 printer was used for inkjet printing the mixture. The mixture was printed over conductive traces on a substrate at a temperature of approximately 25.2 degrees Celsius (° C.), at a drop mass of 5.6 nanograms (ng), and at a velocity of 7 meters per second (m/s). The printed overcoat ink was baked in an oven at 120° C. for 10 minutes.

The printed overcoat ink produced a uniform film over the conductive traces. The printed overcoat ink was found to have high adhesion. The strength of the printed overcoat ink was shown via fold testing and survived 10 plus folding cycles, where one cycle is defined as a 180 degree inward fold and a 360 degree outward fold. The printed overcoat ink also was shown to maintain integrity after being scratched with the tip of sharp tweezers. The conductive traces were found to still be conductive after the fold test when protected by the printed overcoat ink.

The mixture was found to still print after several hours of use. No clogging of the inkjet printhead was observed after three hours of use.

Aerosol Jet Printer Example

In a first embodiment, a mixture of 15.0 grams of Alberdingk U615 and 10.0 grams of diethylene glycol was loaded into a glass vial. The mixture was vortexed to mix the Alberdingk U615 and the diethylene glycol well. The mixture was allowed to settle for approximately 30 minutes. The mixture had a viscosity of approximately 76.51 centipoise. The mixture was produced to have a total TPU content of approximately 24 percent.

In a second embodiment, a mixture of 15.0 grams of Alberdingk U410 and 10.0 grams of diethylene glycol was loaded into a glass vial. The mixture was vortexed to mix the Alberdingk U410 and the diethylene glycol well. The mixture was allowed to settle for approximately 30 minutes. The mixture was produced to have a total TPU content of approximately 24 percent.

In a third embodiment, mixture of 15.0 grams of Alberdingk U615 and 15.0 grams of ethylene glycol was loaded into a glass vial. The mixture was vortexed to mix the Alberdingk U615 and the diethylene glycol well. The mixture was allowed to settle for approximately 30 minutes. The mixture was produced to have a total TPU content of approximately 20 percent.

The mixture from the first embodiment of the aerosol jet printer example was printed using an aerosol jet printer using deionized water in the bubbler to prevent a film forming process from happening in the printing system. The mixture printed well in the aerosol jet printer for several hours without clogging. The printing conditions of the aerosol jet printer are provided below in Table 1:

TABLE 1

| AEROSOL JET PRINTING CONDITIONS | | |
|---|---|---|
| | Flow rate (standard cubic centimeters per minute) | Pressure (pounds per square inch) |
| Sheath | 400 | 0024 |
| Atomization | 900 | 22.05 |
| Exhaust | 600 | 0 |

The printed overcoat ink was printed over several different substrates, such as Clearwater carton board, polycarbonate, and polyethylene naphthalate (PEN). The printed overcoat ink was baked in an oven at 120° C. for 10 minutes.

The printed overcoat ink produced a uniform film over the conductive traces. The printed overcoat ink was found to have high adhesion. The strength of the printed overcoat ink was shown via fold testing and survived 10 plus folding cycles, where one cycle is defined as a 180 degree inward fold and a 360 degree outward fold. The printed overcoat ink also was shown to maintain integrity after being scratched with the tip of sharp tweezers. The conductive traces were found to still be conductive after the fold test when protected by the printed overcoat ink.

It should be noted that the formulations for the printable flexible overcoat ink composition are provided as examples for inkjet printing and aerosol jet printing. However, the formulation and the printable flexible overcoat ink composition may be adjusted for any desired digital printing application. For example, the size of the TPU particles, type of solvent and the amount of solvent mixed with the TPU may be adjusted to tune the viscosity for a particular printing application.

Figure 3:
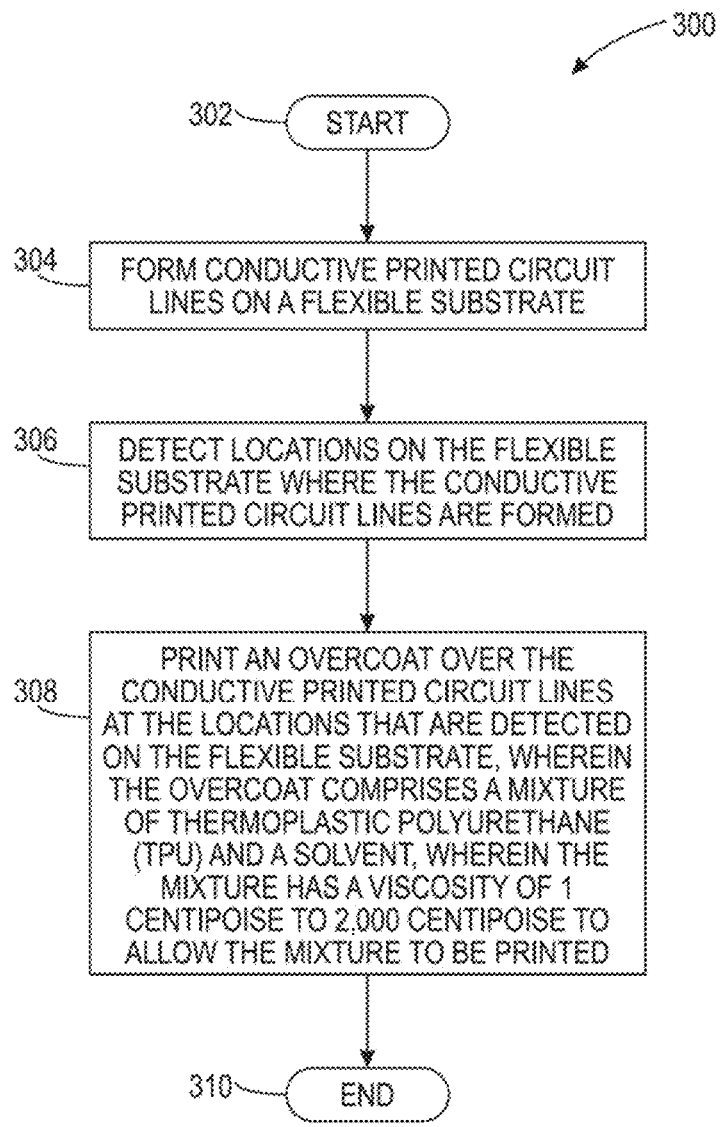
FIG. 3 illustrates a flow chart of an example method for producing a flexible conductive printed circuit with a printed overcoat of the present disclosure.

FIG. 3 illustrates a flow chart of an example method 300 for producing a flexible conductive printed circuit with a printed overcoat of the present disclosure. The method 300 may be performed by the system 100 or the apparatus 400 illustrated in FIG. 4, and described in further details below.

At block 302, the method 300 begins. At block 304, the method 300 forms conductive printed circuit lines on a flexible substrate. For example, the printed circuit lines may be formed in the flexible substrate with any conductive material or metal. For example, the conductive material may include silver, gold, copper, and the like.

In one embodiment, the flexible substrate may provide some movement or flexibility such that the flexible conductive printed circuit can be applied to flexible surfaces, such as clothing, packaging, and the like. In one embodiment, the flexible substrate may include carton board, glass, polyethylene terephthalate (PET), polycarbonate (PC), polyethylene naphthalate (PEN), polystyrene (PS), polyethylene (PE), polymethylmethacrylate, poly(vinyl chloride), cellulose, and the like.

At block 306, the method 300 detects locations on the flexible substrate where the conductive printed circuit lines are formed. In one embodiment, the locations may be stored in memory as the conductive printed circuit lines are formed. The locations may then be provided to a printer to print the overcoat precisely over the conductive printed circuit lines. In one embodiment, the locations may be detected by examining or scanning with an optical imaging device. For example, the optical imaging device may map where the conductive printed circuit lines are located and provide the locations to the printer.

At block 308, the method 300 prints an overcoat over the conductive printed circuit lines at the locations that are detected on the flexible substrate, wherein the overcoat comprises a mixture of thermoplastic polyurethane (TPU) and a solvent, wherein the mixture has a viscosity of 1 centipoise to 2,000 centipoise to allow the mixture to be printed. As noted above, the overcoat may be digitally printed to precisely cover the conductive printed circuit lines. Said another way, the overcoat may be printed to have approximately the same width or slightly larger width (e.g., within a micron or several microns on each side of the conductive printed circuit lines) as the width of the conductive printed circuit lines.

As a result, less overcoat material can be used than would be used when applying the overcoat with a spray coating, draw down coating, blanket coating, and the like. In addition, the overcoat material may be contained to desired locations to prevent the overcoat material from interacting or covering other portions of the substrate that may not need the overcoat, or react negatively with the overcoat.

Moreover, the overcoat of the present disclosure is formulated to allow the overcoat to be dispensed by a digitally addressable or controllable printhead. The overcoat may be stored without evaporating or clogging the apertures of the printhead.

In one embodiment, after the overcoat is printed, the overcoat may be cured. The overcoat may be cured by drying at room temperature or in an oven. For example, the drying time may vary based on the drying temperature. In one embodiment, the overcoat may be cured in an oven and baked at approximately 120 degrees Celsius for 10 minutes. At block 310, the method 300 ends.

Figure 4:
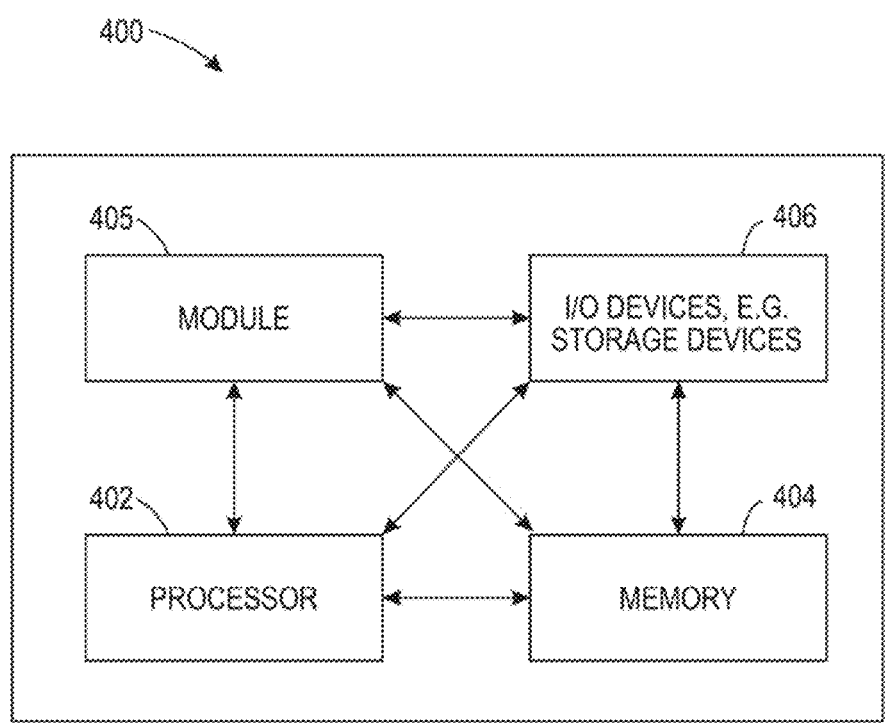
FIG. 4 illustrates a high-level block diagram of an example computer suitable for use in performing the functions described herein.

FIG. 4 depicts a high-level block diagram of a computer that is dedicated to perform the functions described herein. As depicted in FIG. 4, the computer 400 comprises one or more hardware processor elements 402 (e.g., a central processing unit (CPU), a microprocessor, or a multi-core processor), a memory 404, e.g., random access memory (RAM) and/or read only memory (ROM), a module 405 for producing a flexible conductive printed circuit with a printed overcoat, and various input/output devices 406 (e.g., storage devices, including but not limited to, a tape drive, a floppy drive, a hard disk drive or a compact disk drive, a receiver, a transmitter, a speaker, a display, a speech synthesizer, an output port, an input port and a user input device (such as a keyboard, a keypad, a mouse, a microphone and the like)). Although only one processor element is shown, it should be noted that the computer may employ a plurality of processor elements.

It should be noted that the present disclosure can be implemented in software and/or in a combination of software and hardware, e.g., using application specific integrated circuits (ASIC), a programmable logic array (PLA), including a field-programmable gate array (FPGA), or a state machine deployed on a hardware device, a computer or any other hardware equivalents, e.g., computer readable instructions pertaining to the method(s) discussed above can be used to configure a hardware processor to perform the steps, functions and/or operations of the above disclosed methods. In one embodiment, instructions and data for the present module or process 405 for producing a flexible conductive printed circuit with a printed overcoat (e.g., a software program comprising computer-executable instructions) can be loaded into memory 404 and executed by hardware processor element 402 to implement the steps, functions or operations as discussed above in connection with the example method 300. Furthermore, when a hardware processor executes instructions to perform "operations," this could include the hardware processor performing the operations directly and/or facilitating, directing, or cooperating with another hardware device or component (e.g., a co-processor and the like) to perform the operations.

The processor executing the computer readable or software instructions relating to the above described method(s) can be perceived as a programmed processor or a specialized processor. As such, the present module 405 for producing a flexible conductive printed circuit with a printed overcoat (including associated data structures) of the present disclosure can be stored on a tangible or physical (broadly non-transitory) computer-readable storage device or medium, e.g., volatile memory, non-volatile memory, ROM memory, RAM memory, magnetic or optical drive, device or diskette and the like. More specifically, the computer-readable storage device may comprise any physical devices that provide the ability to store information such as data and/or instructions to be accessed by a processor or a computing device such as a computer or an application server.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompassed by the following claims.

What is claimed is:

1. A method for producing flexible conductive printed circuit with a printed overcoat, comprising:
   forming conductive printed circuit lines on a flexible substrate;
   detecting locations on the flexible substrate where the conductive printed circuit lines are formed; and
   printing an overcoat over the conductive printed circuit lines at the locations that are detected on the flexible substrate, wherein the overcoat comprises a mixture of thermoplastic polyurethane (TPU) and a solvent, wherein the TPU comprises a latex TPU dispersion having an average diameter of approximately 1 nanometer (nm) to 1,000 nm, wherein the mixture has a viscosity of 1 centipoise to 2,000 centipoise to allow the mixture to be printed.

2. The method of claim 1, wherein the detecting is based on the locations stored in memory during the forming of the conductive printed circuit lines on the flexible substrate.

3. The method of claim 1, wherein the overcoat is printed to an approximate width of the conductive printed circuit lines.

4. The method of claim 1, wherein the solvent is selected from a group consisting of: water, ethylene glycol, diethylene glycol, sulfolane, propylene glycol methyl ether acetate, propylene glycol monomethyl ether acetate, di(propylene glycol) methyl ether acetate, (propylene glycol) methyl ether, di(propylene glycol) methyl ether, methyl isobutyl ketone, diisobutyl ketone, butyl acetate, methoxyprooylacetate and propoxylated neopentylglycoldiacrylate.

5. The method of claim 1, further comprising:
curing the overcoat.

6. The method of claim 1, wherein the printing of the overcoat is performed by an inkjet printer or an aerosol jet printer.

7. The method of claim 6, wherein the viscosity of the mixture comprises approximately 1 centipoise to 40 centipoise to be dispensed via the inkjet printer.

8. The method of claim 7, wherein a ratio of TPU to solvent ranges from approximately 1:1 to 1:20.

9. The method of claim 6, wherein the viscosity of the mixture of TPU and the solvent comprises approximately 1 centipoise to 2000 centipoise to be dispensed via an aerosol jet printer.

10. The method of claim 9, wherein a ratio of TPU to solvent ranges from approximately 10:1 to 1:20.

11. A method for producing flexible conductive printed circuit with a printed overcoat, comprising:
forming conductive printed circuit lines on a flexible substrate, wherein the flexible substrate is selected from a group consisting of: carton board, glass, polyethylene terephthalate, polycarbonate, polyethylene naphthalate, polystyrene, polyethylene, polymethylmethacrylate, poly(vinyl chloride), and cellulose;
loading into a memory of an inkjet printer or an aerosol jet printer data related to locations of the conductive printed circuit lines;
loading the inkjet printer or the aerosol printer with an overcoat composition, w herein the overcoat composition comprises a mixture of thermoplastic polyurethane (TPU) and a solvent, w herein the TPU comprises a latex TPU dispersion having an average diameter of approximately 1 nanometer (nm) to 1000 nm, wherein the mixture has a viscosity of 1 centipoise to 2000 centipoise to avow the mixture to be printed;
controlling the inkjet printer or the aerosol jet printer via a processor to dispense the overcoat composition onto the locations of the conductive printed circuit lines; and
curing the overcoat.

* * * * *